United States Patent
Hosokawa (10) Patent No.: US 6,936,797 B2
(45) Date of Patent: Aug. 30, 2005

(54) THERMAL PROCESSING METHOD AND THERMAL PROCESSING APPARATUS FOR SUBSTRATE EMPLOYING PHOTOIRRADIATION

(75) Inventor: Akihiro Hosokawa, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 10/460,292

(22) Filed: Jun. 11, 2003

(65) Prior Publication Data

US 2003/0235972 A1 Dec. 25, 2003

(30) Foreign Application Priority Data

Jun. 25, 2002 (JP) .................................... P2002-184449
Jan. 9, 2003 (JP) .................................... P2003-003225

(51) Int. Cl.[7] ................................................ F27B 5/14
(52) U.S. Cl. ........................ 219/405; 219/390; 219/388; 219/411; 219/121.6; 392/416; 392/418; 392/423; 392/424; 118/724; 118/725; 118/50.1; 118/729
(58) Field of Search ................................ 219/390, 388, 219/121.6, 405, 411; 392/418, 416, 423, 424; 118/724, 725, 50.1, 729

(56) References Cited

U.S. PATENT DOCUMENTS 4,525,380 A    6/1985   Arai et al.
4,567,352 A *  1/1986   Mimura et al. ............. 219/405
4,649,261 A    3/1987   Sheets
6,376,806 B2 * 4/2002   Yoo ............................ 219/411
6,518,547 B2 * 2/2003   Takahashi et al. .......... 219/390

FOREIGN PATENT DOCUMENTS

| JP | 57-162340 | 10/1982 |
| JP | 59-169125 | 9/1984 |
| JP | 60-258928 | 12/1985 |
| JP | 63-166219 | 7/1988 |
| JP | 3281018   | 5/2002 |

* cited by examiner

Primary Examiner—Shawntina Fuqua
(74) Attorney, Agent, or Firm—Ostrolenk, Faber, Gerb & Soffen, LLP (57) ABSTRACT

Each of a plurality of flash lamps forming a light source is a bar lamp having an elongated cylindrical shape. The ratio of the distance between the flash lamps and a semiconductor wafer to the distance between the flash lamps and a reflector is set to not more than 1.8 or at least 2.2. Consequently, illuminance is weakened on portions of the main surface of the semiconductor wafer located immediately under the flash lamps along the vertical direction and strengthened in portions located immediately under the clearances between adjacent ones of the flash lamps along the vertical direction, thereby reducing illuminance irregularity on the overall main surface of the semiconductor wafer and improving in-plane uniformity of temperature distribution on the semiconductor wafer. Thus, a thermal processing apparatus capable of improving in-plane uniformity of temperature distribution on a substrate is provided.

12 Claims, 5 Drawing Sheets

THERMAL PROCESSING METHOD AND THERMAL PROCESSING APPARATUS FOR SUBSTRATE EMPLOYING PHOTOIRRADIATION

BACKGROUND OF THE INVENTION

1. Field of the Invention

The present invention relates to a thermal processing method and a thermal processing apparatus for thermally processing a substrate such as a semiconductor wafer or a glass substrate (hereinafter simply referred to as "substrate") by irradiating the same with light.

2. Description of the Background Art

In general, a thermal processing apparatus such as a lamp annealing apparatus using a halogen lamp is employed in an ion activation step for an ion-implanted semiconductor wafer. This thermal processing apparatus heats the semiconductor wafer to a temperature of about 1000° C. to 1100° C. (annealing), for example, thereby carrying out the ion activation step for the semiconductor wafer. This thermal processing apparatus increases the temperature of the substrate at a rate of about hundreds of degrees per second through the energy of light emitted from the halogen lamp.

However, it has been proved that the profile of ions implanted into the semiconductor wafer is rounded, i.e., the ions are thermally diffused when the thermal processing apparatus heating the substrate at the rate of about hundreds of degrees per second carries out the ion activation step. If this phenomenon takes place, the ions implanted into the surface of the semiconductor wafer are diffused also when the same are implanted in high concentration. Therefore, the ions must disadvantageously be implanted beyond necessity.

In order to solve the aforementioned problem, Japanese Patent Application Laying-Open Gazette No. 59-169125 (1984), No. 63-166219 (1988) or the like proposes a technique of irradiating the surface of a semiconductor wafer with flash light through xenon flash lamps or the like thereby increasing the temperature of only the surface of the ion-implanted semiconductor wafer in an extremely short time of not more than several milliseconds. When heating the semiconductor wafer with the xenon flash lamps for an extremely short time, the ions are not diffused due to a shortage of time and hence the thermal processing apparatus can carry out only the ion activation step without rounding the profile of the ions implanted into the semiconductor wafer.

However, the conventional thermal processing apparatus having such a structure has the following problem: The thermal processing apparatus employing xenon flash lamps is provided with a plurality of bar-shaped or similar xenon flash lamps. When the thermal processing apparatus approaches the plurality of xenon flash lamps to the semiconductor wafer, it follows that illuminance is increased in portions of the wafer surface located immediately under the lamps beyond that in the remaining portions, to damage in-plane uniformity of temperature distribution. However, the thermal processing apparatus using the xenon flash lamps having an extremely short heating time cannot employ a method of maintaining in-plane uniformity of illuminance distribution by rotating the wafer dissimilarly to the conventional lamp annealing apparatus using a halogen lamp.

While a reflector is arranged along with the lamps in order to effectively utilize light emitted from the lamps, illuminance reflected by this reflector also has a light intensity distribution on the wafer surface. When the lamps emit light so that the amplitudes of the light intensity distribution of reflected light and a light intensity distribution of irradiation directly applied to the wafer from the lamps substantially coincide with each other, it follows that in-plane uniformity of temperature distribution is further damaged.

SUMMARY OF THE INVENTION

The present invention is directed to a thermal processing apparatus for heating a substrate by irradiating the substrate with light.

According to the present invention, the thermal processing apparatus comprises a light source having a plurality of lamps, a holding element substantially horizontally holding a substrate in a chamber provided under the light source and a reflecting element opposed to the holding element through the light source for reflecting light emitted from the light source, and displaces a peak of illuminance distribution of reflected light introduced into a processed surface of the substrate through the reflecting element with respect to a peak of illuminance distribution of light directly introduced into the processed surface of the substrate from the light source.

It follows that illuminance is weakened on positions of the processed surface of the substrate located immediately under the lamps while illuminance is strengthened on a position located immediately under the clearance between adjacent ones of the lamps, whereby illuminance irregularity is reduced on the overall processed surface of the substrate and in-plane uniformity of temperature distribution on the substrate can be improved.

According to an aspect of the present invention, the thermal processing apparatus comprises a light source having a plurality of lamps, a holding element substantially horizontally holding a substrate in a chamber provided under the light source and a reflecting element opposed to the holding element through the light source for reflecting light emitted from the light source, and sets the ratio of the distance between the light source and the substrate held by the holding element to the distance between the reflecting element and the light source to not more than 1.8 or at least 2.2.

No reflected light from a lamp adjacent to a certain lamp reaches a position located immediately under the certain lamp through the reflecting element, whereby illuminance irregularity is reduced on the overall processed surface of the substrate and in-plane uniformity of temperature distribution on the substrate can be improved.

According to another aspect of the present invention, the thermal processing apparatus comprises a light source formed by horizontally aligning a plurality of bar lamps each having an elongated cylindrical shape in parallel with each other, a holding element substantially horizontally holding a substrate in a chamber provided under the light source and a reflecting element opposed to the holding element through the light source for reflecting light emitted from the light source, and arranges the reflecting element, the light source and the substrate held by the holding element so that the reflecting element reflects no image of an adjacent bar lamp adjacent to each bar lamp through a clearance between each bar lamp and the adjacent bar lamp as viewed from a position of the surface of the substrate held by the holding element located immediately under each of the plurality of bar lamps.

No reflected light from the adjacent bar lamp reaches the position located immediately under each bar lamp through the reflecting element, whereby illuminance irregularity is reduced on the overall processed surface of the substrate and in-plane uniformity of temperature distribution on the substrate can be improved.

The present invention is also directed to a thermal processing method of thermally processing a substrate by irradiating the same with light.

Accordingly, an object of the present invention is to provide a thermal processing method and a thermal processing apparatus capable of improving in-plane uniformity of temperature distribution on a substrate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described in detail with reference to the drawings.

1. First Embodiment

Figure 1:
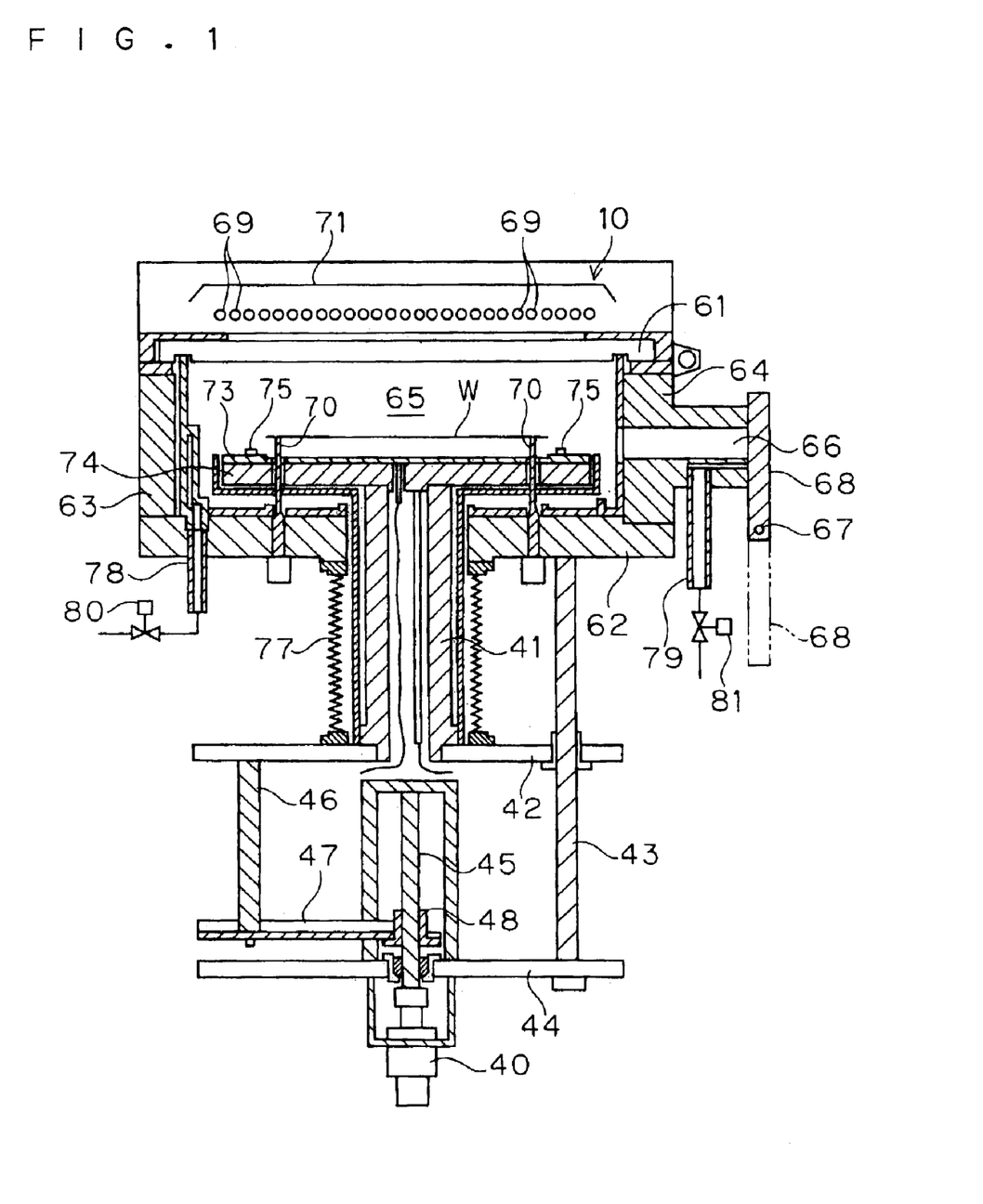
FIGS. 1 and 2 are side sectional views showing a thermal processing apparatus according to a first embodiment of the present invention.
Figure 2:
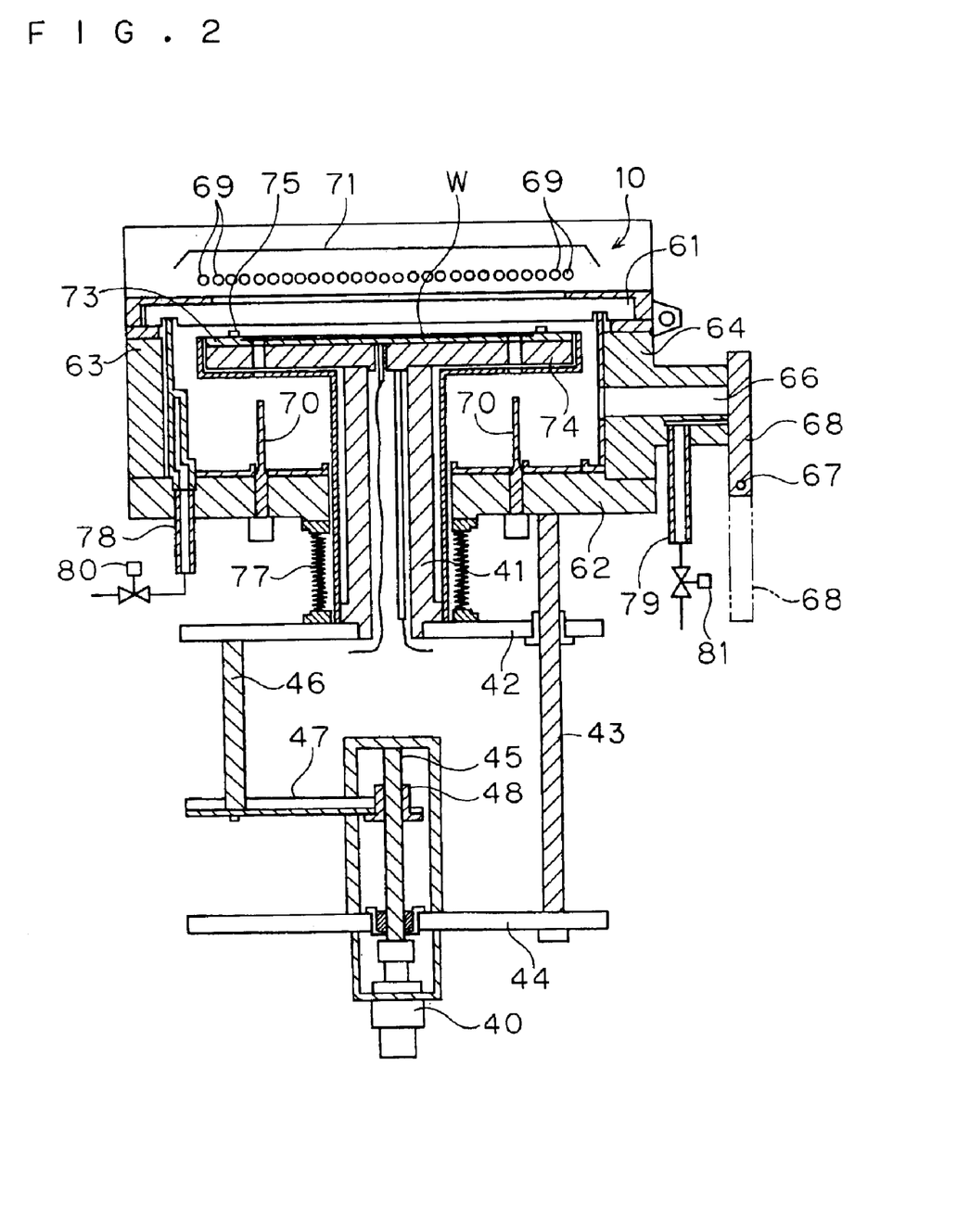

FIGS. 1 and 2 are side sectional views showing a thermal processing apparatus according to a first embodiment of the present invention. This thermal processing apparatus thermally processes a semiconductor wafer W with flash light emitted from xenon flash lamps 69.

This thermal processing apparatus comprises a chamber 65 consisting of a translucent plate 61, a bottom plate 62 and a pair of side plates 63 and 64 for storing the semiconductor wafer W therein and thermally processing the same. The translucent plate 61 forming the upper portion of the chamber 65 is made of an infrared-transparent material such as quartz, for example, for serving as a chamber window transmitting light emitted from a light source 10 and guiding the same into the chamber 65. The bottom plate 62 forming the chamber 65 is uprightly provided with support pins 70 passing through a thermal diffusion plate 73 and a heating plate 74 described later for supporting the semiconductor wafer W from below.

The side plate 64 forming the chamber 65 is formed with a port 66 for introducing and discharging the semiconductor wafer W into and from the chamber 65. The port 66 is openable/closable with a gate valve 68 rotated about a shaft 67. A transport robot (not shown) introduces the semiconductor wafer W into the chamber 65 when the port 66 is opened. When the thermal processing apparatus thermally processes the semiconductor wafer W in the chamber 65, the port 66 is closed.

The chamber 65 is provided under the light source 10. The light source 10 comprises a plurality of (27 in this embodiment) xenon flash lamps (hereinafter also simply referred to as "flash lamps") 69. The plurality of flash lamps 69, which are bar lamps having elongated cylindrical shapes, are horizontally arranged in parallel with each other at a prescribed pitch. A reflector 71 is arranged above the plurality of flash lamps 69 forming the light source 10 to entirely cover the flash lamps 69.

Each of the xenon flash lamps 69 comprises a glass tube filled with xenon gas and provided on both ends thereof with an anode and a cathode connected to an electrical condenser and a trigger electrode wound on the outer periphery of the glass tube. The xenon gas is an electric insulator and hence no electricity flows in the glass tube in a general state. When a high voltage is applied to the trigger electrode for breaking down insulation, electricity instantaneously flows in the glass tube for heating the xenon gas with Joule heat and emitting light. The xenon flash lamps 69 can emit extremely strong light as compared with a continuum source since previously stored electrostatic energy is converted to an extremely short optical pulse of 0.1 ms to 10 ms.

Part of the light emitted from the flash lamps 69 is directly transmitted through the translucent plate 61 and introduced into the chamber 65. The remaining part of the light emitted from the flash lamps 69 is temporarily reflected by the reflector 71, thereafter transmitted through the translucent plate 61 and introduced into the chamber 65.

The thermal diffusion plate 73 and the heating plate 74 are arranged in the chamber 65 in this order. The thermal diffusion plate 73 is stuck to the upper surface of the heating plate 74. The thermal diffusion plate 73 is provided on its surface with pins 75 for preventing the semiconductor wafer W from misregistration.

The heating plate 74 is employed for preheating (assist-heating) the semiconductor wafer W. This heating plate 74 is made of aluminum nitride, and stores a heater and a sensor for controlling the heater therein. On the other hand, the thermal diffusion plate 73 is employed for diffusing thermal energy received from the heating plate 74 and uniformly preheating the semiconductor wafer W. This thermal diffusion plate 73 is made of a material such as sapphire ($Al_2O_3$: aluminum oxide) or quartz having relatively small thermal conductivity.

A motor 40 drives the thermal diffusion plate 73 and the heating plate 74 for vertically moving the same between a position for introducing/discharging the semiconductor wafer W into/from the chamber 65 shown in FIG. 1 and a thermal processing position for the semiconductor wafer W shown in FIG. 2.

The heating plate 74 is coupled to a movable plate 42 through a cylindrical body 41. A guide member 43 suspended from the bottom plate 62 of the chamber 65 vertically movably guides the movable plate 42. A fixed plate 44 is fixed to the lower end of the guide member 43, and the motor 40 rotating/driving a ball screw 45 is arranged on the central portion of the fixed plate 44. The ball screw 45 fits with a nut 48 coupled to the movable plate 42 through coupling members 46 and 47. Thus, the motor 40 can drive and vertically move the thermal diffusion plate 73 and the heating plate 74 between the position for introducing/discharging the semiconductor wafer W into/from the chamber 65 shown in FIG. 1 and the thermal processing position for the semiconductor wafer W shown in FIG. 2.

The thermal diffusion plate 73 and the thermal heating plate 74 are moved down to the position for introducing/discharging the semiconductor wafer W into/from the chamber 65 shown in FIG. 1 so that the thermal processing apparatus can place the semiconductor wafer W introduced into the chamber 65 through the port 66 by the transport robot (not shown) on the support pins 70 or discharge the semiconductor wafer W placed on the support pins 70 from the chamber 65 through the port 66. In this state, the upper ends of the support pins 70 pass through through-holes formed in the thermal diffusion plate 73 and the heating plate 74 to be arranged upward beyond the surface of the thermal diffusion plate 73. For convenience of illustration, FIG. 1 illustrates the through-holes of the thermal diffusion plate 73 and the heating plate 74 not originally illustrated in the side sectional view.

On the other hand, the thermal diffusion plate 73 and the thermal heating plate 74 are moved up to the thermal processing position for the semiconductor wafer W beyond the upper ends of the support pins 70 in order to thermally process the semiconductor wafer W. In the process of upwardly moving the thermal diffusion plate 73 and the thermal heating plate 74 from the position for introducing/discharging the semiconductor wafer W into/from the chamber 65 shown in FIG. 1 to the thermal processing position for the semiconductor wafer W shown in FIG. 2, the thermal diffusion plate 73 receives the semiconductor wafer W placed on the support pins 70, supports the lower surface thereof on its surface, moves up and horizontally holds the semiconductor wafer W on a position in the chamber 65 approximate to the translucent plate 61. In the process of downwardly moving the thermal diffusion plate 73 and the thermal heating plate 74 from the thermal processing position for the semiconductor wafer W shown in FIG. 2 to the position for introducing/discharging the semiconductor wafer W into/from the chamber 65 shown in FIG. 1, on the other hand, the thermal diffusion plate 73 transfers the semiconductor wafer W to the support pins 70.

An elastic bellows 77 for maintaining the chamber 65 in an airtight state is arranged between the bottom plate 62 of the chamber 65 and the movable plate 42 to enclose the cylindrical body 41. The bellows 77 contracts when the thermal diffusion plate 73 and the heating plate 74 are moved up to the thermal processing position while expanding when the thermal diffusion plate 73 and the heating plate 74 are moved down to the position for introducing/discharging the semiconductor plate W for cutting off the atmosphere in the chamber 65 from the external atmosphere.

An introduction path 78 communicatively connected to an on-off valve 80 is formed on the side plate 63 of the chamber 65 opposite to the port 66. This introduction path 78 is employed for introducing gas such as inert nitrogen gas, for example, necessary for processing into the chamber 65. On the other hand, a discharge path 79 communicatively connected to another on-off valve 81 is formed on the port 66 of the side plate 64. This discharge path 79, employed for discharging the gas from the chamber 65, is connected to discharge means (not shown) through the on-off valve 81.

The thermal processing operation of the thermal processing apparatus according to this embodiment for the semiconductor wafer W is now described. This thermal processing apparatus processes the semiconductor wafer W completely subjected to ion implantation.

In this thermal processing apparatus, the transport robot (not shown) introduces the semiconductor wafer W into the chamber 65 through the port 66 and places the same on the support pins 70 while the thermal diffusion plate 73 and the heating plate 74 are arranged on the position for introducing/discharging the semiconductor wafer W into/from the chamber 65 shown in FIG. 1. When the transport robot completely introduces the semiconductor wafer W into the chamber 65, the thermal processing apparatus closes the port 66 with the gate valve 68. Thereafter the motor 40 drives the thermal diffusion plate 73 and the heating plate 74 and moves the same to the thermal processing position for the semiconductor wafer W shown in FIG. 2 for horizontally holding the semiconductor wafer W. The thermal processing apparatus opens the on-off valves 80 and 81 for forming a stream of nitrogen gas in the chamber 65.

The heater built in the heating plate 74 previously heats the thermal diffusion plate 73 and the heating plate 74 to a prescribed temperature. When the thermal processing apparatus moves up the diffusion plate 73 and the heating plate 74 to the thermal processing position for the semiconductor wafer W, therefore, the heated thermal diffusion plate 73 comes into contact with the semiconductor wafer W thereby preheating the same and gradually increasing the temperature of the semiconductor wafer W.

In this state, the thermal diffusion plate 73 continuously heats the semiconductor wafer W. When the thermal diffusion plate 73 increases the temperature of the semiconductor wafer W, a temperature sensor (not shown) regularly monitors whether or not the surface temperature of the semiconductor wafer W reaches a preheating temperature T1.

The preheating temperature T1 is about 200° C. to 600° C., for example. Also when the thermal diffusion plate 73 heats the semiconductor wafer W to this degree of preheating temperature T1, ions implanted into the semiconductor wafer W are not diffused.

When the surface of the semiconductor wafer W reaches the preheating temperature T1, the thermal processing apparatus lights the flash lamps 69 for performing flash heating. In this flash heating step, the thermal processing apparatus lights the flash lamps 69 for about 0.1 ms to 10 ms. Thus, it follows that the flash lamps 69 converting previously stored electrostatic energy to such extremely short optical pulses emit extremely strong flash light.

The surface of the semiconductor wafer W instantaneously reaches a temperature T2 due to such flash heating. The temperature T2 of about 1000° C. to 1100° C. is necessary for ion activation of the semiconductor wafer W. The thermal processing apparatus increases the temperature of the surface of the semiconductor wafer W to the level of this processing temperature T2 thereby activating the ions implanted into the semiconductor wafer W.

At this time, the thermal processing apparatus increases the temperature of the surface of the semiconductor wafer W to the level of the processing temperature T2 in the extremely short time of about 0.1 ms to 10 ms, thereby completing the ion activation step for the semiconductor wafer W in a short time. Therefore, the ions implanted into the semiconductor wafer W are not diffused but the thermal processing apparatus can prevent the profile of the ions implanted into the semiconductor wafer W from rounding. The time necessary for the ion activation step is extremely short as compared with the time necessary for diffusion of the ions and hence the thermal processing apparatus completes the ion activation step in the short time of about 0.1 ms to 10 ms causing no diffusion.

Further, the thermal processing apparatus heating the surface of the semiconductor wafer W to the preheating temperature T1 of about 200° C. to 600° C. with the heating plate 74 before lighting the flash lamps 69 for heating the semiconductor wafer W can quickly increase the temperature of the semiconductor wafer W to the level of the processing temperature T2 of about 1000° C. to 1100° C. with the flash lamps 69.

After completing the flash heating step, the motor 40 drives the thermal diffusion plate 73 and the heating plate 74 and moves down the same to the position for introducing/discharging the semiconductor wafer W into/from the chamber 65 shown in FIG. 1 while the thermal processing apparatus opens the port 66 with the gate valve 68. The transport robot (not shown) discharges the semiconductor wafer W placed on the support pins 70 from the chamber 65. Thus, the thermal processing apparatus completes the thermal processing operation.

When the thermal processing apparatus opposes the surface of the semiconductor wafer W to the flash lamps 69, it follows that illuminance in the portions located immediately under the flash lamps 69 exceeds that in the remaining portions to damage in-plane uniformity of temperature distribution, as already described. According to the first embodiment, therefore, the thermal processing apparatus sets the distance between the surface of the semiconductor wafer W and each flash lamp 69 to not more than 1.8 assuming that the distance between each flash lamp 69 and the reflector 71 is 1, to be capable of uniformly thermally processing the semiconductor wafer W with the plurality of flash lamps 69. The description is now continued with respect to this.

Figure 3:
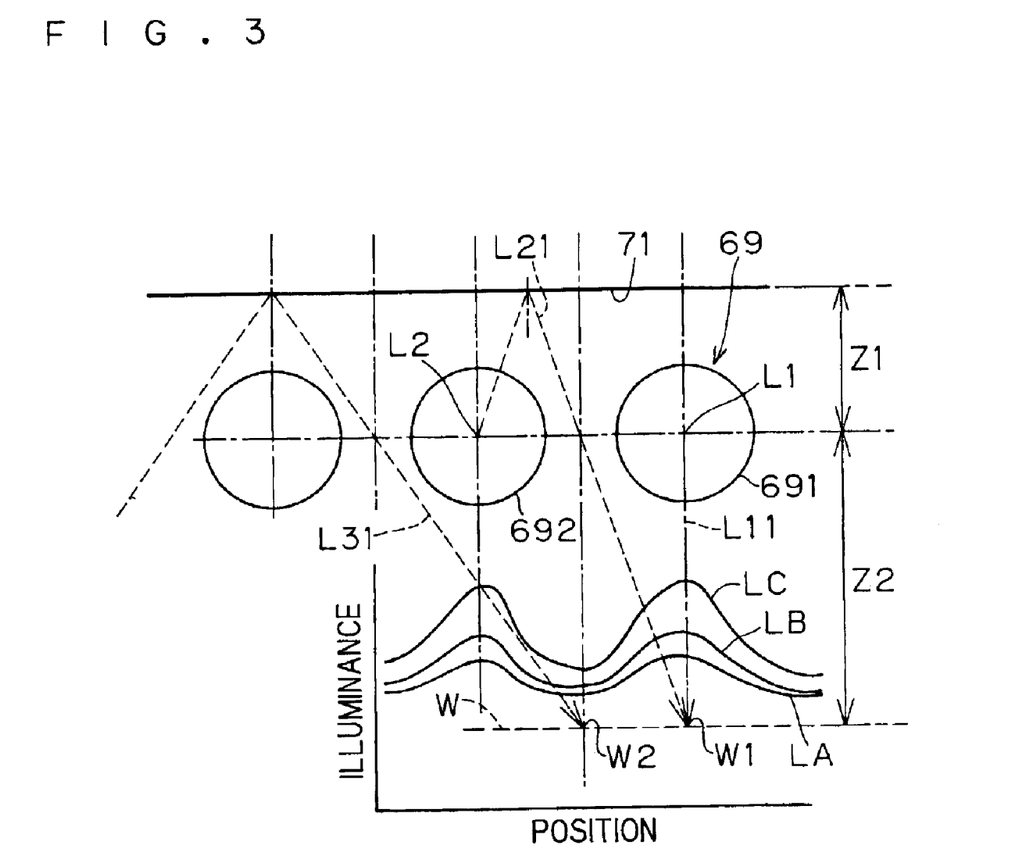
FIG. 3 typically illustrates the relation between illuminance of light emitted from flash lamps on the surface of a semiconductor wafer and positions of provision of the flash lamps.

FIG. 3 is a graph typically showing the relation between illuminance of the light emitted from the flash lamps 69 on the surface of the semiconductor wafer W and the positions of the flash lamps 69.

Referring to this graph, symbol LA denotes illuminance distribution of light reflected by the reflector 71 and applied to the surface of the semiconductor wafer W, symbol LB denotes illuminance distribution of light directly applied to the surface of the semiconductor wafer W from the flash lamps 69, and symbol LC denotes total illuminance distribution of the illuminance distribution LA and the illuminance distribution LB on the surface of the semiconductor wafer W.

The flash lamps 69 include a plurality of lamps 691 and 692 arranged at a constant interval. The illuminance distribution LB has a peak on a position W1 of the surface of the semiconductor wafer W located immediately under the lamp 691 due to direct irradiation L11 from the center L1 of the lamp 691. Also as to the lamp 692, the illuminance distribution LB has a peak on a position located immediately under the center L2.

As viewed from the position W1, the reflector 71 reflects the lamp 692 adjacent to the lamp 691 through the clearance between the lamps 691 and 692. In other words, irradiation L21 emitted from the lamp 692 and reflected by the reflector 71 is introduced into the position W1 as shown in FIG. 3. This state is implemented when the interval Z1 between the center L1 of the lamp 691 and the reflector 71 and the interval Z2 between the center L1 of the lamp 691 and the semiconductor wafer W are in the ratio 1:2 in length. At this time, no irradiation L31 emitted from any flash lamp 69, reflected by the reflector 71 and introduced into the surface of the semiconductor wafer W reaches a position W2 located immediately under the clearance between the lamps 691 and 692. Consequently, the light reflected by the reflector 71 attains the illuminance distribution LA. Assuming that the reflector 71 is formed by a member having a high reflectance of at least 95%, for example, the illuminance distribution LA is relatively lower in intensity than the illuminance distribution LB due to elongation of the irradiation distance of the reflected light.

When the intervals Z1 and Z2 are in the ratio 1:2 as described above, peaks of the illuminance distribution LA and the illuminance distribution LB coincide with the centers L1 and L2 of the flash lamps 691 and 692 respectively. Therefore, the surface of the semiconductor wafer W exhibits the total illuminance distribution LC of the illuminance distribution LA and the illuminance distribution LB, and the peaks thereof are superposed with each other to result in large dispersion.

Figure 4:
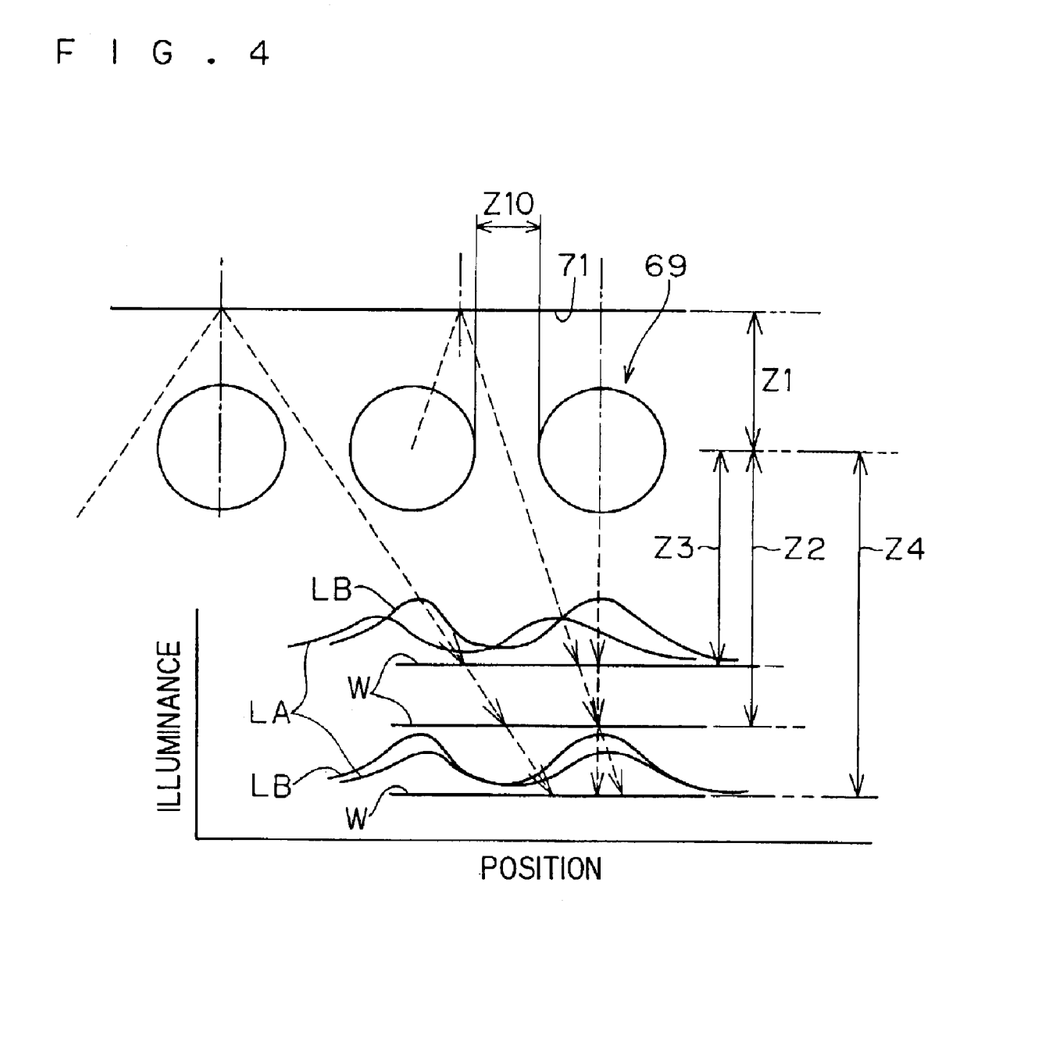
FIG. 4 typically illustrates another relation between illuminance of light emitted from the flash lamps on the surface of the semiconductor wafer and positions of provision of the flash lamps.

Therefore, the thermal processing apparatus according to this embodiment displaces the peaks of the illuminance distribution LA and the illuminance distribution LB from each other thereby reducing dispersion of the total illuminance distribution LC and reducing illuminance irregularity on the overall main surface of the semiconductor wafer W. More specifically, the thermal processing apparatus sets the ratio of the distance between the surface of the semiconductor wafer W and each flash lamp 69 to the distance between each flash lamp 69 and the reflector 71 to less than 2, as shown in FIG. 4. According to the first embodiment, the thermal processing apparatus sets the interval Z1 between each flash lamp 69 and the reflector 71 and the interval Z3 between the surface of the semiconductor wafer W and each flash lamp 69 to the ratio 1:1.8 so that the interval Z3 is 45 mm assuming that the interval Z1 is 25 mm, for example. The interval Z10 between the lamps 691 and 692 is 2 mm. Consequently, the peaks of the illuminance distribution LB resulting from a main heating step utilizing direct light from the flash lamps 69 and the illuminance distribution LA resulting from a sub-heating step utilizing the light reflected by the reflector 71 are displaced from each other. In the total illuminance distribution LC of the illuminance distribution LA and the illuminance distribution LB on the surface of the semiconductor wafer W, therefore, dispersion is reduced also when the peaks of the illuminance distribution LA and the illuminance distribution LB are superposed with each other.

The aforementioned ratio Z3/Z1 is preferably not more than 1.8. The irradiation L21 passing through the clearance between the lamps 691 and 692 exhibits a certain degree of width due to the interval Z10 between the lamps 691 and 692. If the ratio Z3/Z1 is slightly less than 2, therefore, no effect of displacing the peaks of the illuminance distribution LA and the illuminance distribution LB is attained. Therefore, the ratio Z3/Z1 is selected from the range of not more than 1.8, thereby obtaining illuminance distribution having small dispersion in intensity.

Figure 5:
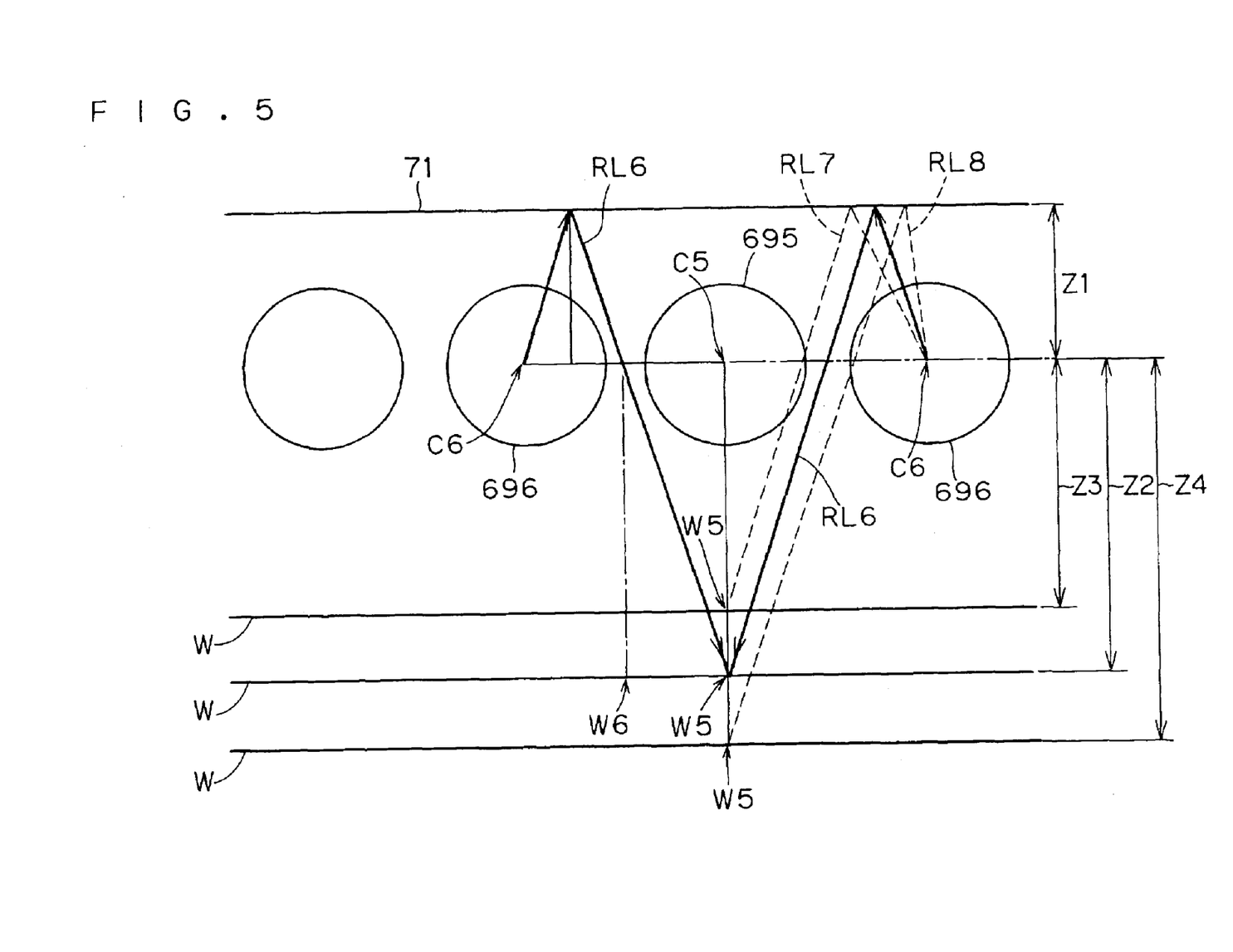
FIG. 5 is a model diagram showing the arrangement relation between a reflector, flash lamps and a semiconductor wafer.

If the absolute value of the distance between the center of each flash lamp 69 and the semiconductor wafer W is large, illuminance distribution of irradiation light directly applied from the flash lamps 69 to the semiconductor wafer W is hardly dispersed. In other words, the aforementioned illuminance distribution LB is substantially flattened. Also in this case, illuminance distribution on the surface of the semiconductor wafer W is dispersed when the ratio of the distance between the lamp center of each flash lamp 69 and the semiconductor wafer W held by the thermal diffusion plate 73 to the distance between the lamp center and the reflector 71 reaches 2, for the following reason:

FIG. 5 is a model diagram showing the arrangement relation of the reflector 71, the flash lamps 69 and the semiconductor wafer W. It is assumed that numeral 695 denotes a noted lamp arbitrarily selected from among the plurality of flash lamps 69 and numeral 696 denotes adjacent lamps adjacent to the noted lamp 695.

Reflected light components RL6 emitted from the adjacent lamps 696 and regularly reflected by the reflector 71 to pass through the clearances between the adjacent lamps 696 an the noted lamp 695, more specifically the midpoints between the centers C6 and C5 of the adjacent lamps 696 and the noted lamp 695, reach a position W5 of the surface of the semiconductor wafer W located immediately under the lamp center C5 when the interval between the lamp center C5 and the semiconductor wafer W reaches the value Z2, i.e., when the ratio of the distance between the lamp center of each flash lamp 69 and the semiconductor wafer W to the distance between the lamp center and the reflector 71 reaches 2. Further, the reflected light components RL6 from the adjacent lamps 696 provided on both sides of the noted lamp 695 reach the position W5 in a superposed manner. On the other hand, no light reflected by the reflector 71 reaches a position W6 of the surface of the semiconductor wafer W located immediately under the midpoint between the lamp center C5 of the noted lamp 695 and the lamp center C6 of one of the adjacent lamps 696.

In other words, it follows that the reflector 71 reflects images of the adjacent lamps 696 through the clearances between the noted lamp 695 and the adjacent lamps 696 as viewed from the position W5 of the surface of the semiconductor wafer W held by the thermal diffusion plate 73 located immediately under the noted lamp 695. As viewed from the position W6 of the surface of the semiconductor wafer W located immediately under the midpoint between the noted lamp 695 and one of the adjacent lamps 696, on the other hand, the reflector 71 reflects the semiconductor wafer W itself through the clearance between the noted lamp 695 and one of the adjacent lamps 696.

Therefore, it follows that illuminance distribution on the surface of the semiconductor wafer W is dispersed to damage in-plane uniformity of temperature distribution when the ratio of the distance between the lamp center of each flash lamp 69 and the semiconductor wafer W to the distance between the lamp center and the reflector 71 reaches 2, regardless of presence/absence of dispersion of illuminance distribution of light directly emitted from the flash lamps 69.

When setting the interval between the lamp center C5 and the semiconductor wafer W to the value Z3 thereby setting the ratio of the distance between the lamp center of each flash lamp 69 and the semiconductor wafer W to the distance between the lamp center and the reflector 71 to 1.8, the noted lamp 695 itself blocks reflected light RL7 emitted from the other one of the adjacent lamps 696 and regularly reflected by the reflector 71 to reach the position W5 located immediately under the lamp center C5, for preventing the reflected light RL7 from reaching the position W5. It follows that the reflected light component RL6 passing through the clearance between the other one of the adjacent lamps 696 and the noted lamp 695 reaches a position other than the position W5 located immediately under the lamp center C5 while no reflected light component RL6 from one of the adjacent lamps 696 opposed to the other one of the adjacent lamps 696 through the noted lamp 695 reaches this position, so that the reflected light components RL6 from the adjacent lamps 696 provided on both sides of the noted lamp 695 are not superposed with each other.

In other words, the thermal processing apparatus arranges the reflector 71, the plurality of flash lamps 69 and the semiconductor wafer W so that the reflector 71 reflects no image of any adjacent lamp 696 from the clearance between any flash lamp 69 and the adjacent lamp 696 as viewed from the position of the surface of the semiconductor wafer W held by the thermal diffusion plate 73 located immediately under each of the plurality of flash lamps 69, i.e., so that the reflector 71 reflects an image of the semiconductor wafer W or the thermal diffusion plate 73 from the clearance.

Thus, dispersion in illuminance distribution is reduced on the surface of the semiconductor wafer W irradiated with flash light from the flash lamps 69, so that the thermal processing apparatus can improve in-plane uniformity of temperature distribution on the semiconductor wafer W.

In order to let the reflector 71 reflect no image of any adjacent lamp 696 from the clearance between each flash lamp 69 and the adjacent lamp 696 as viewed from the position of the surface of the semiconductor wafer W located immediately under each of the plurality of flash lamps 69, the thermal processing apparatus may set the ratio of the distance between the lamp center of each flash lamp 69 and the semiconductor wafer W to the distance between the lamp center and the reflector 71 to not more than 1.8. According to such arrangement relation of the reflector 71, the plurality of flash lamps 69 and the semiconductor wafer W, the thermal processing apparatus can reduce dispersion of illuminance distribution on the surface of the semiconductor wafer W irradiated with the flash light from the flash lamps 69 for improving in-plane uniformity of temperature distribution on the semiconductor wafer W.

2. Second Embodiment

A thermal processing apparatus according to a second embodiment of the present invention is now described. The thermal processing apparatus according to the second embodiment is identical in structure to that according to the first embodiment except the aforementioned ratio. The thermal processing apparatus according to the second embodiment is also identical in thermal processing operation to that according to the first embodiment.

The thermal processing apparatus according to the second embodiment sets the interval Z1 between each flash lamp 69 and a reflector 71 and the interval Z4 between the surface of a semiconductor wafer W and each flash lamp 69 to the ratio 1:2.2 as shown in FIG. 4, so that the interval Z4 is 55 mm assuming that the interval Z1 is 25 mm, for example. The interval Z10 between lamps 691 and 692 is 2 mm. Consequently, peaks of illuminance distribution LB resulting from a main heating step utilizing direct light from the flash lamps 69 and illuminance distribution LA resulting from a sub-heating step utilizing light reflected by the reflector 71 are displaced from each other. Therefore, dispersion is reduced in total illuminance distribution LC of the illuminance distribution LA and the illuminance distribution LB on the surface of a semiconductor wafer W also when the peaks of the illuminance distribution LA and the illuminance distribution LB are superposed with each other.

According to the second embodiment, the ratio Z4/Z1 is preferably at least 2.2. Irradiation L21 passing through the clearance between the lamp 691 and another lamp 692 exhibits a certain degree of width due to an interval Z10 between the lamps 691 and 692. If the ratio Z4/Z1 slightly exceeds 2, therefore, no effect of displacing the peaks of the illuminance distribution LA and the illuminance distribution LB is attained. Therefore, the ratio Z4/Z1 is selected from the range of at least 2.2 thereby obtaining illuminance distribution having small dispersion in intensity.

If the absolute value of the distance between the center of each flash lamp 69 and the semiconductor wafer W is large, illuminance distribution of irradiation light directly applied from the flash lamps 69 to the semiconductor wafer W is hardly dispersed, as hereinabove described. It has also been already described that illuminance distribution on the surface of the semiconductor wafer W is dispersed to damage in-plane uniformity of temperature distribution when the ratio of the distance between the lamp center of each flash lamp 69 and the semiconductor wafer W to the distance between the lamp center and the reflector 71 reaches 2, regardless of presence/absence of dispersion of illuminance distribution of light directly emitted from the flash lamps 69.

When the thermal processing apparatus sets the distance between a lamp center C5 and the semiconductor wafer W to the level Z4 in FIG. 5, i.e., when setting the ratio of the distance between the lamp center of each flash lamp 69 and the semiconductor wafer W to the distance between the lamp center and the reflector 71 to 2.2, an adjacent lamp 696 itself blocks reflected light RL8 emitted from the adjacent lamp 696 and regularly reflected by the reflector 71 to reach a position W5 located immediately under the lamp center C5, not to reach the position W5. It follows that a reflected light component RL6 passing through the clearance between the adjacent lamp 696 and a noted lamp 695 reaches a position other than the position W5 located immediately under the lamp center C5 and no reflected light component RL6 from another adjacent lamp 696 opposite to the adjacent lamp 696 through the noted lamp 695 reaches this position, so that the reflected light components RL6 from the adjacent lamps 696 provided on both sides of the noted lamp 695 are not superposed with each other.

In other words, the thermal processing apparatus arranges the reflector 71, a plurality of flash lamps 69 and the semiconductor wafer W so that the reflector 71 reflects no image of any adjacent lamp 696 from the clearance between any flash lamp 69 and the adjacent lamp 696 as viewed from the position of the surface of the semiconductor wafer W held by the thermal diffusion plate 73 located immediately under each of the plurality of flash lamps 69, i.e., so that the reflector 71 reflects an image of the semiconductor wafer W or the thermal diffusion plate 73 from the clearance.

Thus, dispersion in illuminance distribution is reduced on the surface of the semiconductor wafer W irradiated with flash light from the flash lamps 69, so that the thermal processing apparatus can improve in-plane uniformity of temperature distribution on the semiconductor wafer W.

In order to let the reflector 71 reflect no image of any adjacent lamp 696 from the clearance between each flash lamp 69 and the adjacent lamp 696 as viewed from the position of the surface of the semiconductor wafer W located immediately under each of the plurality of flash lamps 69, the thermal processing apparatus may set the ratio of the distance between the lamp center of each flash lamp 69 and the semiconductor wafer W to the distance between the lamp center and the reflector 71 to at least 2.2. According to such arrangement relation of the reflector 71, the plurality of flash lamps 69 and the semiconductor wafer W, the thermal processing apparatus can reduce dispersion of illuminance distribution on the surface of the semiconductor wafer W irradiated with the flash light from the flash lamps 69 for improving in-plane uniformity of temperature distribution on the semiconductor wafer W.

The present invention is not restricted to the aforementioned embodiments but can also be executed in other modes as follows:

(1) While the thermal processing apparatus according to each of the aforementioned embodiments irradiates the semiconductor wafer W with light for performing ion activation, the substrate to be processed by the inventive thermal processing apparatus is not restricted to the semiconductor wafer W. For example, the thermal processing apparatus according to the present invention may alternatively process a glass substrate formed with any silicon film such as a silicon nitride film or a polycrystalline silicon film. For example, silicon is ion-implanted into a polycrystalline silicon film formed on a glass substrate by CVD for forming an amorphous silicon film, followed by formation of a silicon oxide film for serving as an anti-reflection coating thereon. In this state, the thermal processing apparatus according to the present invention can irradiate the overall surface of the amorphous silicon film with light for forming a polycrystalline silicon film by polycrystallizing the amorphous silicon film.

(2) The thermal processing apparatus according to the present invention can irradiate a TFT substrate, having a structure obtained by forming an underlayer silicon oxide film and a polysilicon film prepared by crystallizing amorphous silicon on a glass substrate and doping the polysilicon film with an impurity such as phosphorus or boron, with light for activating the impurity implanted into the polysilicon film in the doping step.

Further, it is possible to apply various design changes in the range of the subject matter described in the scope of claim for patent.

While the invention has been shown and described in detail, the foregoing description is in all aspects illustrative and not restrictive. It is therefore understood that numerous modifications and variations can be devised without departing from the scope of the invention.

What is claimed is:

1. A thermal processing apparatus for heating a substrate by irradiating said substrate with light, comprising:
   a light source having a plurality of lamps;
   a holding element substantially horizontally holding said substrate in a chamber provided under said light source; and
   a reflecting element opposed to said holding element through said light source for reflecting light emitted from said light source,
   said thermal processing apparatus displacing a peak of illuminance distribution of reflected light introduced into a processed surface of said substrate through said reflecting element with respect to a peak of illuminance distribution of light directly introduced into said processed surface of said substrate from said light source.

2. The thermal processing apparatus according to claim 1, wherein
   each of said plurality of lamps is a bar lamp having an elongated cylindrical shape, and
   said plurality of lamps are aligned in parallel with said substrate held by said holding element to define a clearance between said lamps.

3. The thermal processing apparatus according to claim 2, wherein
   each of said plurality of lamps is a xenon flash lamp, and
   said holding element comprises an assist-heating element preheating held said substrate.

4. A thermal processing apparatus for heating a substrate by irradiating said substrate with light, comprising:
   a light source having a plurality of lamps;

a holding element substantially horizontally holding said substrate in a chamber provided under said light source; and a substantially flat reflecting element opposed to said holding element through said light source for reflecting light emitted from said light source, said thermal processing apparatus setting the ratio of the distance between said light source and said substrate held by said holding element to the distance between said substantially flat reflecting element and said light source to not more than 1.8 or at least 2.2.

5. The thermal processing apparatus according to claim 4, wherein each of said plurality of lamps is a bar lamp having an elongated cylindrical shape, and said plurality of lamps are aligned in parallel with said substrate held by said holding element to define a clearance between said lamps, said thermal processing apparatus setting the ratio of the distance between the centers of said plurality of lamps and said substrate held by said holding element to the distance between said centers of said plurality of lamps and said reflecting element to not more than 1.8 or at least 2.2.

6. The thermal processing apparatus according to claim 5, wherein each of said plurality of lamps is a xenon flash lamp, and said holding element comprises an assist-heating element preheating held said substrate.

7. A thermal processing apparatus for heating a substrate by irradiating said substrate with light, comprising:

a light source formed by horizontally aligning a plurality of bar lamps each having an elongated cylindrical shape in parallel with each other;

a holding element substantially horizontally holding said substrate in a chamber provided under said light source; and a reflecting element opposed to said holding element through said light source for reflecting light emitted from said light source, said thermal processing apparatus arranging said reflecting element, said light source and said substrate held by said holding element so that said reflecting element reflects no image of any adjacent bar lamp adjacent to each said bar lamp through a clearance between each said bar lamp and said adjacent bar lamp as viewed from a position of the surface of said substrate held by said holding element located immediately under each of said plurality of bar lamps.

8. The thermal processing apparatus according to claim 7, setting the ratio of the distance between the centers of said plurality of bar lamps and said substrate held by said holding element to the distance between said centers of said plurality of bar lamps and said reflecting element to not more than 1.8 or at least 2.2.

9. The thermal processing apparatus according to claim 8, wherein each of said plurality of bar lamps is a xenon flash lamp, and said holding element comprises an assist-heating element preheating held said substrate.

10. The thermal processing apparatus according to claim 1, wherein said plurality of lamps are a plurality of flash lamps, said thermal processing apparatus heating said substrate by emitting flash light from said plurality of flash lamps.

11. The thermal processing apparatus according to claim 4, wherein said plurality of lamps are a plurality of flash lamps, said thermal processing apparatus heating said substrate by emitting flash light from said plurality of flash lamps.

12. The thermal processing apparatus according to claim 7, wherein said plurality of bar lamps are a plurality of flash lamps, said thermal processing apparatus heating said substrate by emitting flash light from said plurality of flash lamps.

* * * * *